United States Patent
Li et al.

(10) Patent No.: US 10,594,246 B2
(45) Date of Patent: Mar. 17, 2020

(54) BOARD-LEVEL MOTOR CONTROL SYSTEM WITH INTEGRATED PROTECTION AND CONTROL COMPONENTS

(71) Applicant: Eaton Corporation, Cleveland, OH (US)

(72) Inventors: Huaqiang Li, Menomonee Falls, WI (US); Joshua B. Gross, Cranberry, PA (US); Joseph Paul Uphaus, Whitefish Bay, WI (US); Thomas M. Ruchti, Pewaukee, WI (US); Kaijam M. Woodley, Brown Deer, WI (US)

(73) Assignee: Eaton Intelligent Power Limited, Dublin (IE)

( * ) Notice: Subject to any disclaimer, the term of this patent is extended or adjusted under 35 U.S.C. 154(b) by 39 days.

(21) Appl. No.: 15/854,096

(22) Filed: Dec. 26, 2017

(65) Prior Publication Data
US 2019/0199263 A1 Jun. 27, 2019

(51) Int. Cl.
*H02P 27/04* (2016.01)
*H02H 7/08* (2006.01)
*H02M 7/5387* (2007.01)
*H02H 9/04* (2006.01)
*H05K 1/02* (2006.01)
*H02H 9/02* (2006.01)

(52) U.S. Cl.
CPC ......... *H02P 27/045* (2013.01); *H02H 7/0822* (2013.01); *H02H 9/02* (2013.01); *H02H 9/04* (2013.01); *H02M 7/53875* (2013.01); *H05K 1/0257* (2013.01)

(58) Field of Classification Search
CPC ................................. H02P 27/0045

USPC ........................................................ 318/727
See application file for complete search history.

(56) References Cited

U.S. PATENT DOCUMENTS 4,356,525 A 10/1982 Komrumpf et al.
5,824,990 A 10/1998 Geissler et al.
5,894,415 A 4/1999 Habegger
(Continued)

OTHER PUBLICATIONS

"PowerGate 'H' HVAC Bypass Controller," Mitsubishi Electric Corporation, Feb. 2, 2017, pp. 1-2, https://us.mitsubishielectric.com/fa/en/solutions/industries/hvac/powergatehseries.

*Primary Examiner* — Jorge L Carrasquillo
*Assistant Examiner* — Devon A Joseph
(74) *Attorney, Agent, or Firm* — Ziolkowski Patent Solutions Group, SC

(57) ABSTRACT

A motor control system for selectively controlling power from a power source to a load is provided. The motor control system includes at least one PCB structure and a plurality of protection and control components mounted onto the at least one PCB structure so as to be electrically coupled therewith. The plurality of protection and control components includes a power converter operable to provide a controlled output power to the load, a plurality of switching devices operable to selectively control power flow from the power source into the power converter and to bypass the power converter, and one or more protection devices configured to selectively interrupt current flow from the power source to the power converter during a fault condition. The motor control system also includes a housing enclosing the at least one PCB structure and the plurality of protection and control components.

20 Claims, 7 Drawing Sheets

(56) References Cited

U.S. PATENT DOCUMENTS

| | | | |
|---|---|---|---|
| 6,163,129 A | 12/2000 | Younger et al. | |
| 6,356,044 B1* | 3/2002 | Archer | H02K 11/33 318/538 |
| 7,224,557 B2 | 5/2007 | Kinsella et al. | |
| 7,719,219 B2 | 5/2010 | Baumann et al. | |
| 7,940,018 B2 | 5/2011 | Yonemori et al. | |
| 8,014,110 B2* | 9/2011 | Schnetzka | F25B 49/025 318/434 |
| 8,228,019 B2 | 7/2012 | Higuchi et al. | |
| 8,693,170 B2 | 4/2014 | Barreau et al. | |
| 9,018,882 B2* | 4/2015 | Mack | H02P 27/06 318/494 |
| 9,641,095 B1 | 5/2017 | Wild et al. | |
| 2004/0113594 A1* | 6/2004 | Athari | H02M 1/4225 323/222 |
| 2004/0262997 A1 | 12/2004 | Gull et al. | |
| 2008/0094771 A1 | 4/2008 | Messersmith et al. | |
| 2008/0103632 A1 | 5/2008 | Saban et al. | |
| 2008/0136259 A1* | 6/2008 | Coffey | H02B 1/04 307/11 |
| 2012/0098261 A1 | 4/2012 | Rozman et al. | |
| 2013/0076126 A1 | 3/2013 | Hashimoto | |
| 2013/0235494 A1* | 9/2013 | Holce | H02H 3/08 361/31 |
| 2013/0299271 A1* | 11/2013 | Endo | B62D 5/046 180/446 |
| 2013/0307355 A1* | 11/2013 | Sakamaki | B25F 5/008 310/50 |
| 2014/0043732 A1* | 2/2014 | McKay | H02B 1/04 361/622 |
| 2014/0307367 A1* | 10/2014 | Maeda | H05K 7/1465 361/640 |
| 2015/0035286 A1 | 2/2015 | Stephens | |
| 2015/0162864 A1 | 6/2015 | Moghadas et al. | |
| 2015/0171733 A1 | 6/2015 | Zargari et al. | |
| 2015/0283911 A1 | 10/2015 | Ambrosio | |
| 2016/0043670 A1 | 2/2016 | Nakamura et al. | |
| 2016/0156278 A1* | 6/2016 | Ramm | H02B 1/20 361/624 |
| 2016/0242313 A1* | 8/2016 | Singh | H05K 1/184 |
| 2016/0268797 A1 | 9/2016 | Li et al. | |
| 2016/0373017 A1 | 12/2016 | Mima et al. | |
| 2017/0110991 A1 | 4/2017 | Frampton et al. | |
| 2018/0034403 A1 | 2/2018 | Kim et al. | |
| 2018/0076745 A1* | 3/2018 | Cox | H02P 6/28 |
| 2018/0167002 A1 | 6/2018 | Frampton et al. | |
| 2018/0178830 A1 | 6/2018 | Koseki et al. | |

\* cited by examiner

BOARD-LEVEL MOTOR CONTROL SYSTEM WITH INTEGRATED PROTECTION AND CONTROL COMPONENTS

BACKGROUND OF THE INVENTION

Embodiments of the invention relate generally to motor control systems and, more particularly, to a board-level motor control system having integrated protection and control components.

One type of system commonly used in industry that performs power conversion is an adjustable speed drive, also known as a variable frequency drive (VFD). A VFD is an industrial control device that provides for variable frequency, variable voltage operation of a driven system, such as an AC induction motor. In use, a VFD is often provided as part of a motor control system and overall control and protection assembly that includes the VFD as well as an arrangement of input/output fuses, disconnects, circuit breakers or other protection devices, controllers, filters, sensors, and a bypass assembly that includes one or more of a bypass contactor and soft starter that provide alternate control paths or mechanisms for controlling the driven system.

As a general rule in known motor control systems, the VFD and associated protection and control devices, generally indicated as components 2 in FIG. 1, are provided as discrete components having their own housings 4. The discrete, housed components 2 are positioned within a large metal enclosure 6. The arrangement of components 2 is fixed to a support within the enclosure 6, such as a DIN rail for example, with wiring 8 being provided between the components 2 to provide for electrical connectivity and/or communication therebetween. When the overall collection of components 2 is assembled as a unit, the enclosure 6 required to house the components 2 becomes quite large and bulky. Also, the large amount of wiring 8 required between the components 2 can hinder accessibility to the components 2, increases installation time and the potential for failure due to wiring and wiring connections, and reduces the overall efficiency of the motor control system.

It would therefore be desirable to provide a motor control system with a minimized footprint, increased efficiency, improved operational flexibility, and the ability for shared thermal management for multiple components.

BRIEF DESCRIPTION OF THE INVENTION

In accordance with one aspect of the invention, a motor control system for selectively controlling power from a power source to a load is provided. The motor control system includes at least one printed circuit board (PCB) structure and a plurality of protection and control components mounted onto the at least one PCB structure so as to be electrically coupled therewith. The plurality of protection and control components includes a power converter operable to provide a controlled output power to the load, a plurality of switching devices operable to selectively control power flow from the power source into the power converter and to bypass the power converter, and one or more protection devices configured to selectively interrupt current flow from the power source to the power converter during a fault condition. The motor control system also includes a housing enclosing the at least one PCB structure and the plurality of protection and control components.

In accordance with another aspect of the invention, a motor control system for selectively controlling power from a power source to a load, is provided. The motor control system includes a PCB structure comprising at least one substrate and a plurality of conductive traces formed on the at least one substrate and a motor switching assembly integrated onto the PCB structure. The motor switching assembly further includes a power converter operable to provide a controlled output power to the load and a plurality of switching devices operable to selectively control power flow from the power source into the power converter and to bypass the power converter. The motor control system also includes a controller coupled to the PCB structure and configured to control operation of the power converter and the plurality of switching devices. The conductive traces form electrical connections within the motor switching assembly and electrically connect the motor switching assembly to the controller.

In accordance with yet another aspect of the invention, a method of manufacturing a board-level motor control system for controlling power from a power source to a load is provided. The method includes providing a PCB structure comprising at least one substrate and a plurality of conductive traces formed on the at least one substrate and mounting a plurality of protection and control components onto the PCB structure, wherein mounting the plurality of protection and control components comprises one of snapping respective plug-and-play components of the plurality of protection and control components onto the PCB structure and soldering respective components of the plurality of protection and control components onto the PCB structure. The method also includes electrically connecting the plurality of protection and control components via the plurality of conductive traces.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention relate to a compact, board-level motor control system. The board-level motor control system has integrated solid-state contactors, drives, filters, and protection devices (e.g., fuses) at a circuit board level, such that electrical connections between the components can be made via electrical traces on the board and without the use of separate cables or wires. A single, compact plastic enclosure may be provided for the board-level motor control system that replaces the typical bulky metal enclosure and individual component housings that are found in existing motor control systems.

While embodiments of the invention are described and illustrated herebelow as being directed to a motor control system, it is recognized that embodiments of the invention are not meant to be limited to such circuits. That is, embodiments of the invention may be extended more generally to power/energy conversion circuits of varying constructions and implementations, including motor starters, motor control centers, and power/energy conversion circuits for driving non-motor loads, for example. Accordingly, the following discussion of a board-level motor control system is not meant to limit the scope of the invention.

Figure 2:
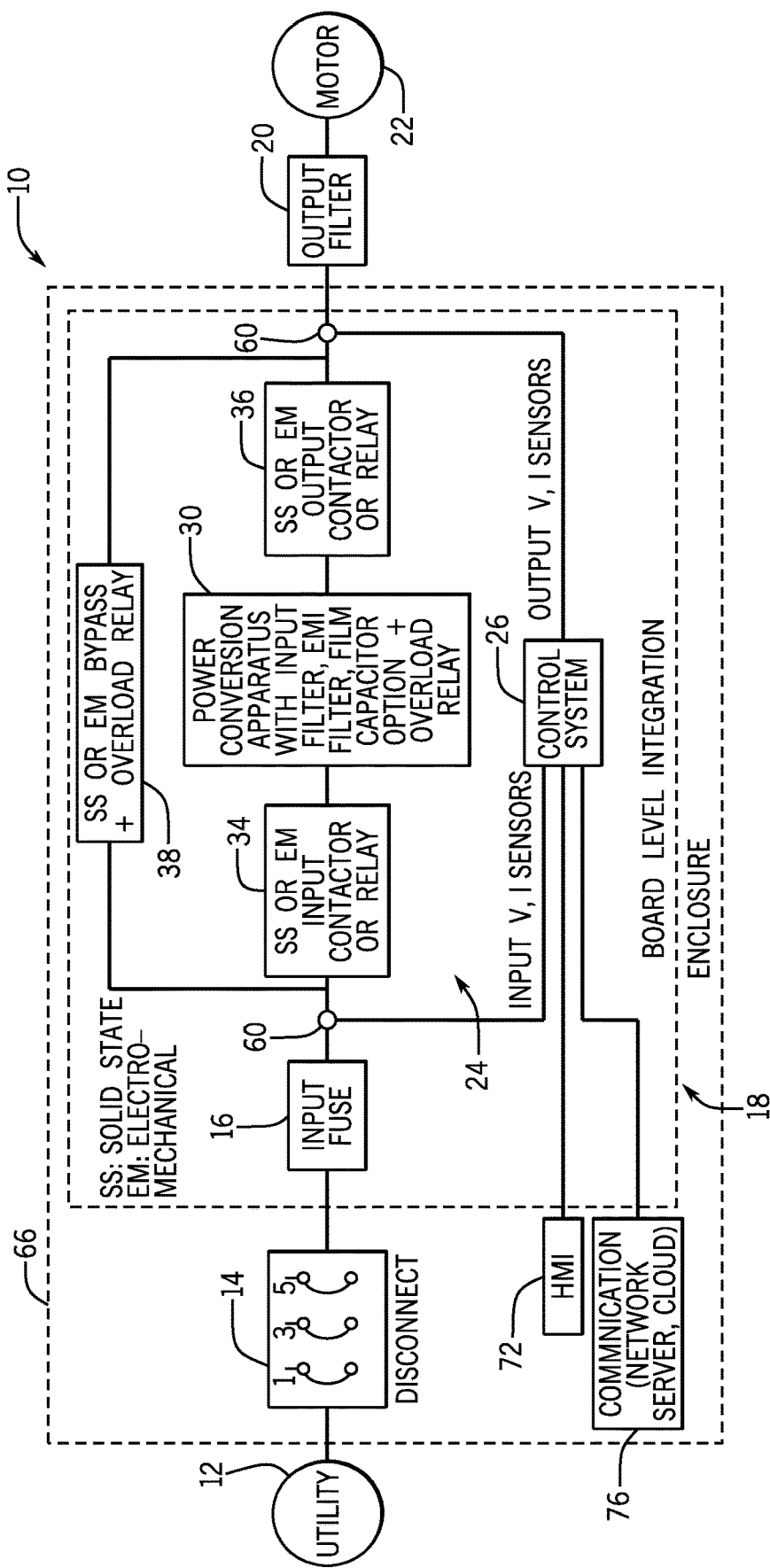
FIG. 2 is a block diagram of a board-level motor control system, according to an embodiment of the invention.

Referring to FIG. 2, a block schematic of a power system 10 is shown. Power system 10 includes a power source 12, such as from a utility, for example, coupled to a disconnect contactor or switch 14 that may be operated in a closed or On position in which power from utility 12 is allowed to flow therethrough and an open or Off position in which power may not flow therethrough. Power system 10 also includes an input fuse 16 coupled to disconnect switch 14. Input fuse 16 provides overcurrent protection by interrupting the current from utility 12 if the level of current becomes too high. Input fuse 16 is coupled to (and may be considered part of) a motor control system 18, which is then coupled to an optional output filter 20 that helps protect a motor 22 (or other load) from the harmful effects of reflected waves due to impedance mismatch and prevent motor failure due to insulation failure, overheating, and noise.

Figure 3A:
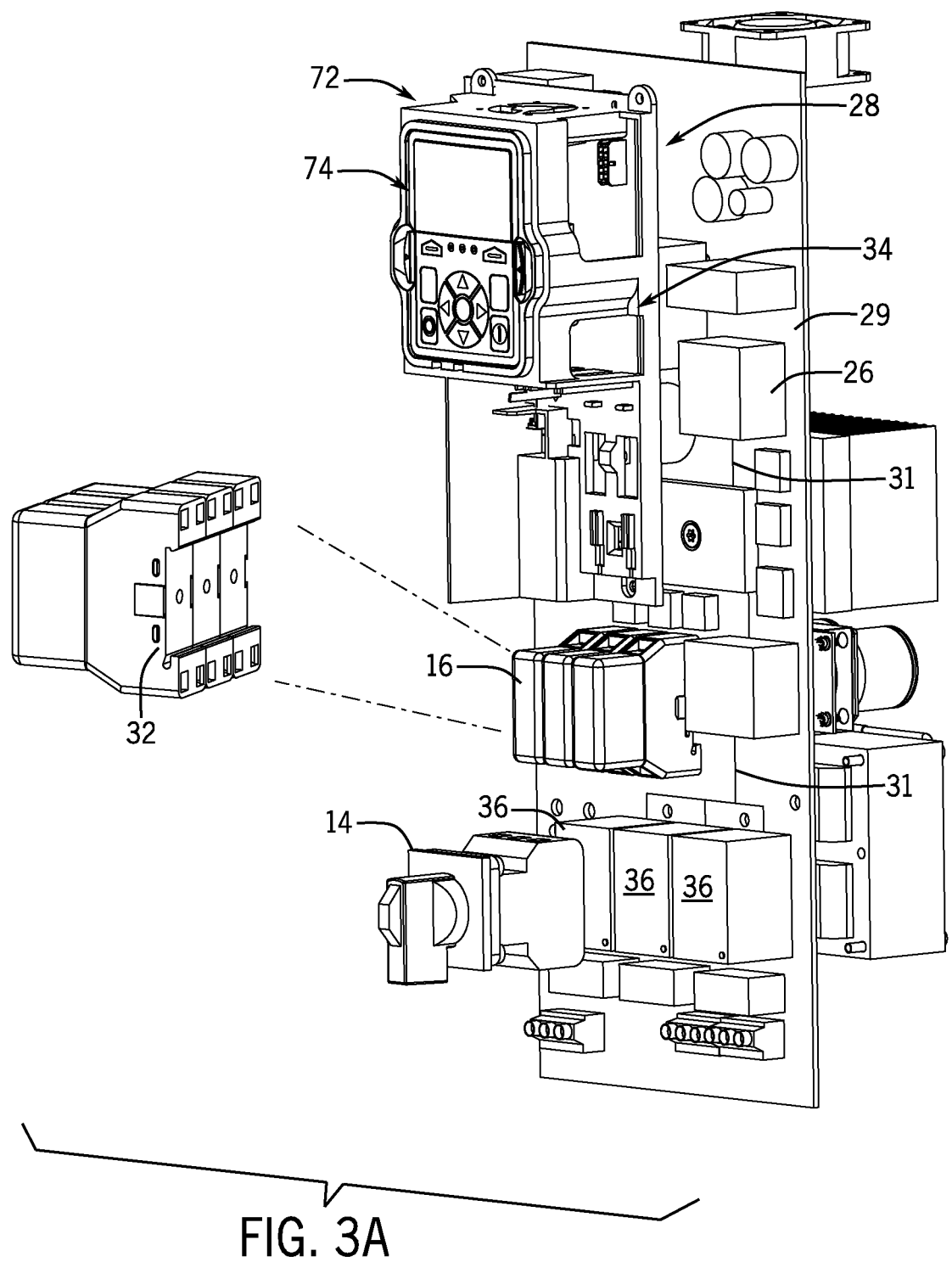
FIGS. 3A and 3B are perspective views of the board-level motor control system of FIG. 2, according to an embodiment of the invention.
Figure 3B:
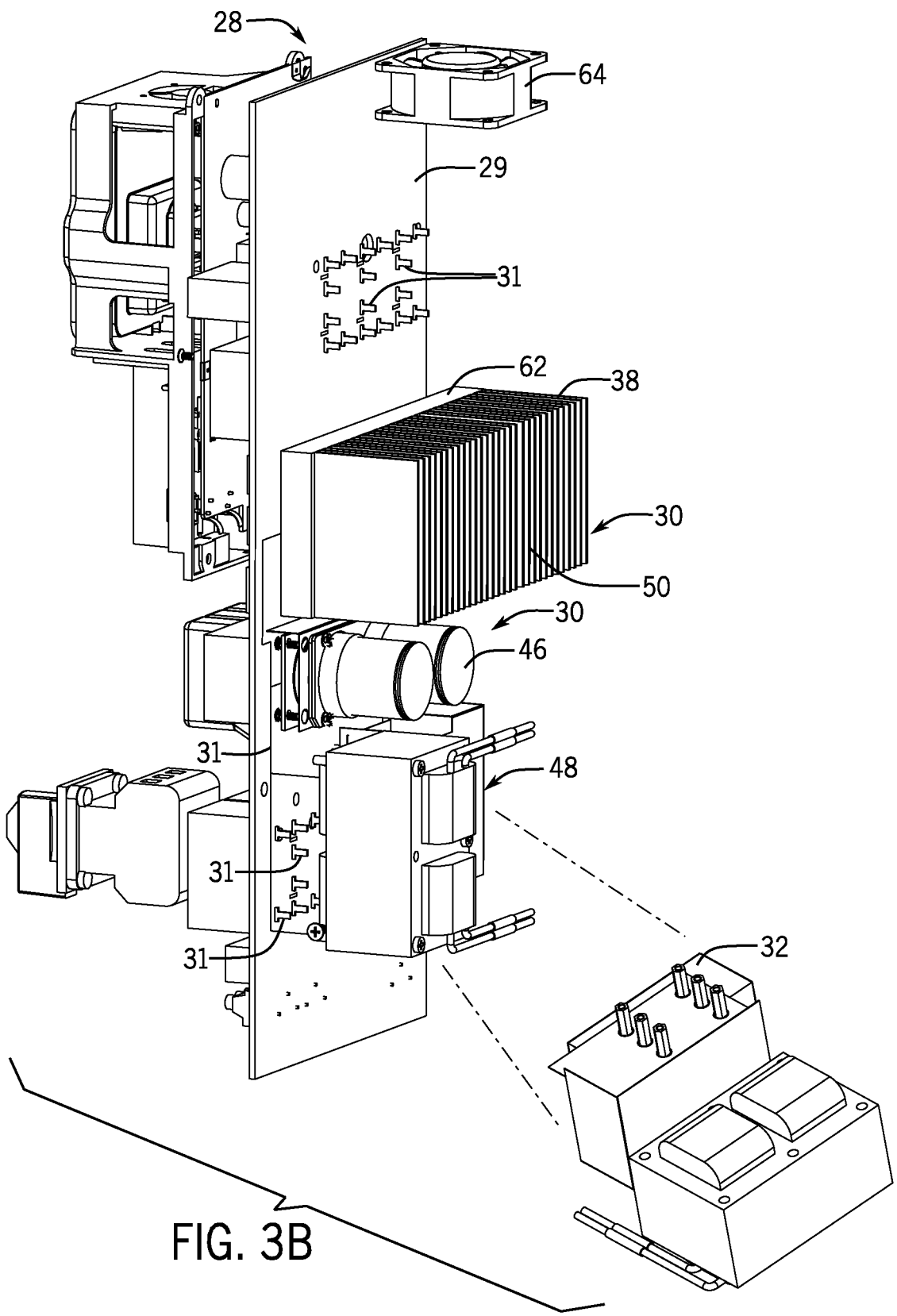

As shown in FIG. 2 and also now in FIGS. 3A and 3B, motor control system 18 includes a motor switching assembly or module 24 and a control system or controller 26 that provides control signals to various components of motor switching assembly 24 (and may optionally control the position of disconnect switch 14). According to embodiments of the invention, the motor control system 18 is provided as a board-level circuit, with the system including a plurality of protection and control components/devices that are mounted to or formed directly on a printed circuit board (PCB) 28. The PCB 28 may be provided as a single board or as a modular board (i.e., two or more distinct PCBs) and may have a standard or customized construction. The PCB 28 includes an insulating substrate 29 with a plurality of traces or leads 31 formed thereon that provide electrical connection paths on the substrate 29 between components. The plurality of components included in motor switching assembly 24 that are mounted to or formed on the PCB 28 provide for control and protection of motor 22 and may include, without limitation, a power converter 30 and input, output, and bypass switching devices or relays 34, 36, 38.

According to embodiments of the invention, the board-level components 16, 30, 34, 36, 38 may be removably or fixedly mounted on the PCB 28 according to alternative embodiments. In one embodiment, some or all of components 16, 30, 34, 36, 38 are provided with slot and/or pin type plug-and-play type attachment components 32 (see FIGS. 3A and 3B) that snap onto or interfit with mating plug-and-play type receptacles mounted on the PCB 28. Alternatively, some or all of components 16, 30, 34, 36, 38 are permanently soldered to the PCB 28. The components 16, 30, 34, 36, 38 may be electrically connected to the PCB 28 via contact pads on the PCB 28 that mate with or are soldered to corresponding pads on the respective components. Regardless of whether components 16, 30, 34, 36, 38 are removably or fixedly mounted to PCB 28, electrical connections and communications between the components 16, 30, 34, 36, 38 (and controller 26) may be provided via the traces 31 formed on the PCB 28 substrate. This mounting of components 16, 30, 34, 36, 38 directly to PCB 28 and use of electrical traces 31 to form connections between components results in a board-level motor switching assembly 24 having fewer terminal connections and cables, such that voltage losses in the motor switching assembly 24 are reduced and efficiency of the board is improved.

Figure 4:
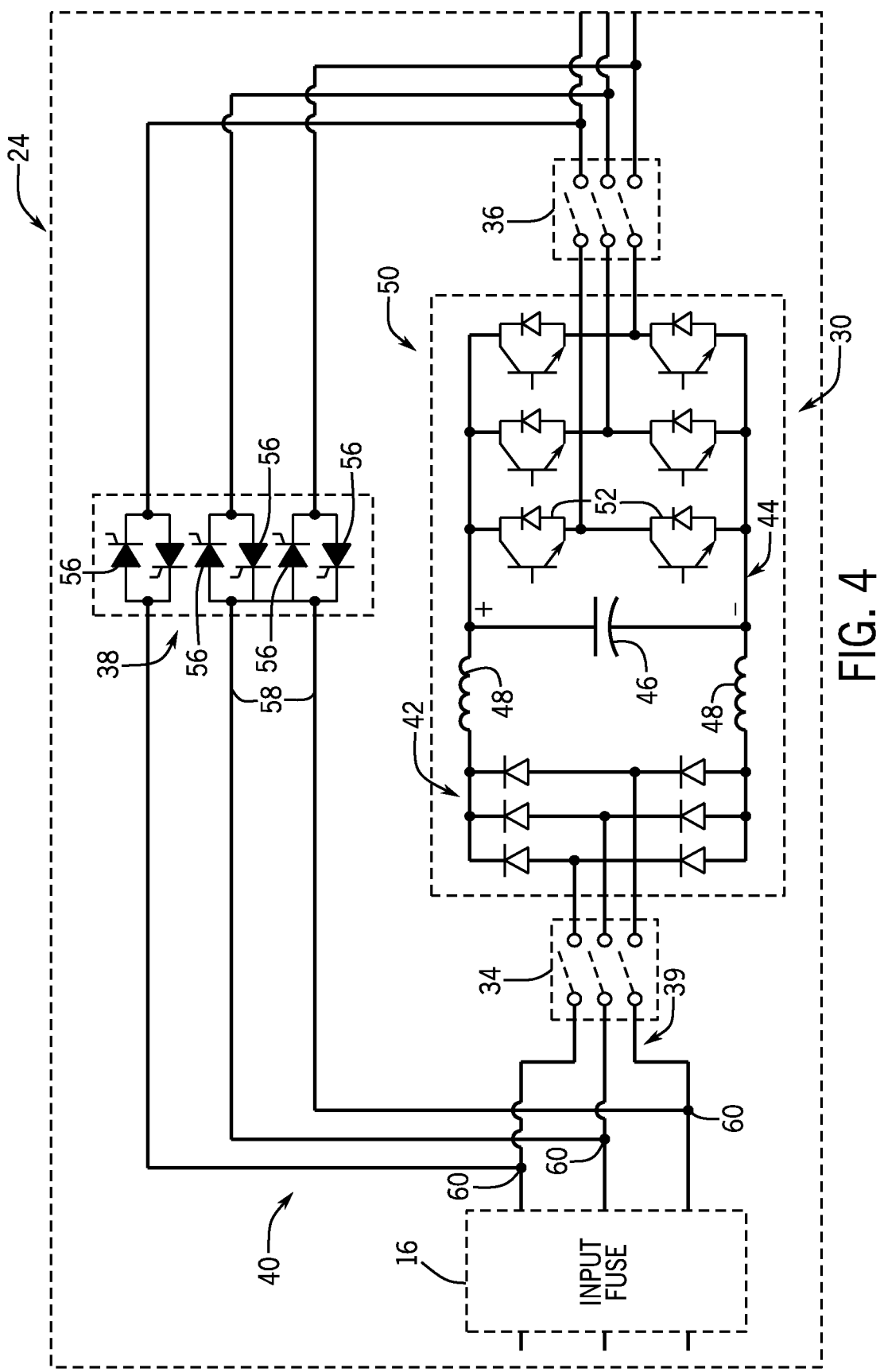
FIG. 4 is a schematic diagram of a motor switching assembly included in the motor control system of FIG. 2 and FIGS. 3A and 3B, according to an embodiment of the invention.

As shown in FIG. 4, one embodiment of motor control system 18 includes a power converter 30 in the form of a VFD unit (hereafter "VFD unit 30") that provides for driving and adjusting the operating speed of motor 22. VFD unit 30 may be of known construction that may generally include: a rectifier bridge 42 that converts an AC input power into a DC power, a DC link 44 that receives the DC power from the rectifier bridge, a DC link capacitor bank 46 across DC link, and optional inductors 48 coupled in series with and on either side of the rectifier bridge 42 on DC link 44 (i.e., a DC choke). The VFD unit 30 may also include an inverter 50 to convert the DC power to AC power—with the inverter 50 being comprised of a plurality of solid-state switches 52 (e.g., IGBTs) that may be selectively controlled to output a desired three-phase, three line power from the VFD unit 30 and to the motor 22. While not shown in FIG. 4, it is recognized that input and EMI filters may be provided with VFD unit 30. The three-phase power output by VFD unit 30 is regulated/controlled by controller 26 via the transmission of gate drive signals to the inverter switches 52 to control opening and closing thereof, thereby controlling the current flow (and therefore the voltage) applied to the motor 22.

As further shown in FIG. 4, the input, output, and bypass switching devices 34, 36, 38 may be configured as solid-state type switching devices or as electromechanical switches. In the embodiment of FIG. 4, input and output switching devices 34, 36 are shown as electromechanical relays/contactors, while bypass switching device 38 is shown as a solid-state switching device that includes a pair of anti-parallel solid-state switches 56 on each phase 58, such as solid-state switches in the form of silicon controlled rectifiers (SCRs) or thyristors that control the current flow through bypass switching device 38 and provide for a "soft-starter" functionality. The electromechanical input and output relays 34, 36 may thus be operated in an On/closed state to conduct current therethrough and an Off/open state to block current therethrough, while solid-state switches 56 of bypass switching device 38 may be operated an On/closed state to conduct current therethrough, an Off/open state to block current therethrough, or selectively switched On/Off to control transmission of voltage and current therethrough and thereby limit the transient voltages and current to the motor 22—allowing for a soft ramp-up of the motor 22. Solid-state switches 56 further allow controller 26 to control bypass switching device 38 as an overload relay based on overvoltage and/or overcurrent conditions present in power system 10 (FIG. 2).

In operation of motor control system, controller 26 selectively operates the motor switching assembly 24 in what are termed herein as a VFD mode (i.e., power conversion mode) or a bypass mode of operation, with power being provided to motor 22 through VFD unit 30 in the VFD mode of operation and power being provided to motor 22 through a bypass path 40 (with VFD unit 30 disconnected) in the bypass mode of operation. In the case of an inverter fault, over temperature fault, or other error in the VFD unit 30, motor operation can be automatically transferred to the bypass path 40 to continue operation of the motor 22, maintain drive life, and for other benefits. The controller 26 may also determine to transfer motor operation to the bypass path 40 when it is desired to operate the motor 22 in a steady-state condition (e.g., full speed) that does not require power conditioning by the VFD unit 30, such that bypassing thereof might be beneficially employed to reduce switching losses, etc.

In controlling operation of motor switching assembly 24 in the VFD mode and bypass mode of operation, controller 26 controls operation of switching devices 34, 36, 38 via the opening and closing of mechanical contacts or solid-state switches thereof, such as via the transmission of control signals or gate drive signals thereto. By controlling opening and closing of switching devices 34, 36, 38, current through the VFD unit 30 can be selectively controlled. More specifically, the input relay 34 and output relay 36 provide for current flow through VFD unit 30 when in an On/closed state or position and do not allow current flow through VFD unit 30 when in an Off/open state or position (instead electrically isolating the VFD unit 30 from power source 12 and motor 22), while the bypass switching device 38 provides for current flow through bypass path 40 when SCRs 56 are in an On/closed state or position and diverts current away from the bypass path 40 when SCRs 56 are in an Off/open state or position. It is recognized that bypass switching device 38 will be controlled to be in the Off state when input and output relays 34, 36 are in the On position (with this being the VFD mode of operation of motor switching assembly 24) and that bypass switching device 38 will be controlled to be in the On state when input and output relays 34, 36 are in the Off position (with this being the bypass mode of operation of motor switching assembly 24).

According to embodiments of the invention, the controller 26 may make a determination of whether to operate the motor switching assembly 24 in the VFD mode or the bypass mode of operation based on a number of inputs and/or measured parameters. In one embodiment, the controller 26 may make the determination of whether to operate motor switching assembly 24 in VFD mode or bypass mode based upon one or more inputs by an operator indicating that the motor 22 is to be operated in a steady-state condition (e.g., at full speed) that does not require power conditioning by the VFD unit 30, such that bypassing thereof might be beneficially employed (e.g., to reduce switching losses). In another embodiment, the controller 26 may make this determination based upon detection that the VFD unit 30 has experienced a fault condition or is otherwise not functioning properly. That is, controller 26 may compare one or more voltage and/or current values measured in the VFD unit 30, as inputs to the VFD unit, or as outputs from the VFD unit (such as measured by voltage and/or current sensors or sensing circuits 60 (FIG. 2), for example), to one or more pre-defined thresholds in order to sense a short circuit or other fault condition in the motor switching assembly. For example, one or more voltage or current sampling or sensing circuits or sensors 60 may operate to measure one or more of the following voltage/current parameters in the motor switching assembly, including: three phase input currents or voltages to the VFD unit 30, current at the switch level of rectifier 42 or inverter 50 and/or on DC link 44 in the VFD unit 30, and/or load output currents or voltages from the VFD unit 30, for example. As one example, the controller 26 compares the DC link voltage to a pre-defined "Overvoltage Condition" to determine if the VFD unit 30 has malfunctioned.

Beneficially, integration of the switching devices 34, 36, 38 onto PCB 28 at a board-level and the operability and control of the switching devices 34, 36, 38 by controller 26 allows for simplification of the motor switching assembly 24. That is, the integration of the switching devices 34, 36, 38 onto PCB 28 at the board-level eliminates the need for auxiliary devices that sense/determine the state of switching devices/relays 34, 36, 38, as such functionality or firmware is provided in controller 26. Additionally, integration of the switching devices 34, 36, 38 onto PCB 28 at the board-level allows for a single controller or central processor to control operation of switching devices 34, 36, 38 and VFD unit 30 based on inputs or sensed parameters provided to controller 26, as described above. The board-level construction of control system 18 and its singular controller 26 eliminates need for multiple discrete control circuits or processors (e.g., overload processor and bypass processor) and/or a micro-programmable multi-processor (MMP) of prior art topologies. All sensor hardware, functions, and digital signal processing may be built into the board-level motor control system 18, making an overload relay and associated sensors and processors unnecessary (i.e., a common current sense functionality for motor overload in system 18).

In addition to the above, construction of motor control system 18 as a board-level circuit provides advantages regarding power supply and thermal management. As one example, the board-level motor control system 18 may derive control powers from input power provided by utility source 12 (FIG. 2), as compared to typical motor control system designs/products where a standalone, commercially available power supply is required to provide control power. As another example, construction of motor control system 18 as a board-level circuit allows for efficient system-level temperature monitoring and management of the motor switching assembly 24 via the use of one or more thermal management devices 62, 64, such as thermocouples for component temperature monitoring, shared heat sinks for cooling of multiple board-mounted components (e.g., heat sink 62 for cooling VFD unit 30 and solid-state bypass switching device 38), and airflow generator(s) 64 (e.g., fan) to manage airflow across the PCB 28 and components thereon.

Figure 1:
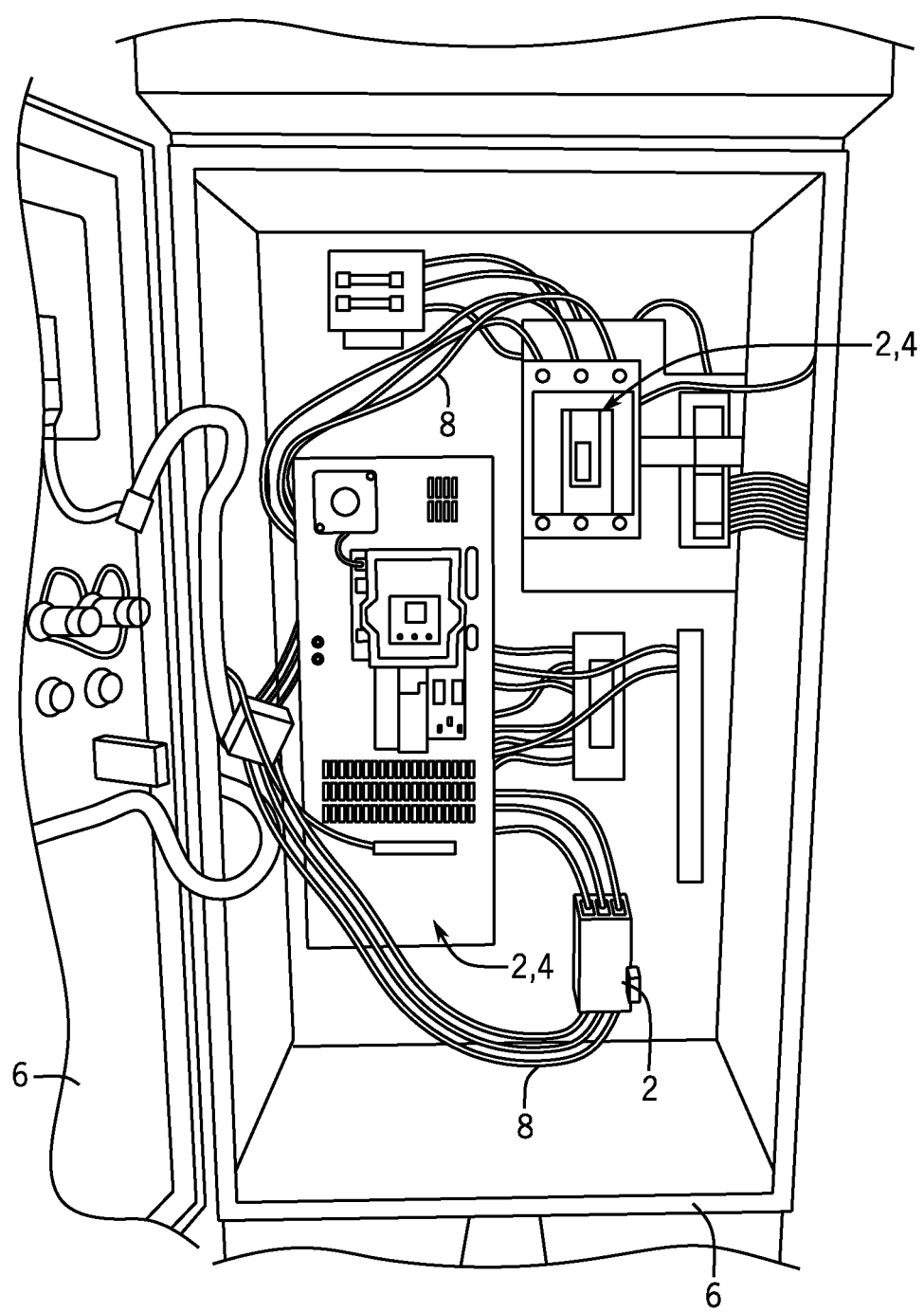
FIG. 1 is a schematic view of a motor control system as known in the prior art.

As shown in FIGS. 3A and 3B, board-level components 16, 30, 34, 36, 38 are integrated onto PCB 28 without their own discrete, environmentally rated enclosures or housings (e.g., National Electrical Manufacturer Association (NEMA), Ingress Protection (IP), and/or Underwriters Laboratories Inc. (UL)). Instead, motor control system 18 is housed within a compact housing 66 (FIG. 5) that provides protection for the components and meets environmental ratings standards (i.e., ingress protection standards) for the overall motor control system 18. Housing 66 is constructed from an electrically non-conductive material such as, for example, plastic. The size of the housing 66 is greatly reduced as compared to a standard large metal enclosure (e.g., housing 6, FIG. 1) that encloses a motor drive system having discrete protection and control devices (each with its own housing and being connected via cabling). For example, the compact plastic housing 66 of motor control system 18 may have dimensions of 20.5"×8"×10.25", as compared to a standard large metal enclosure having dimensions of 36"× 20.5"×12.00".

Figure 5:
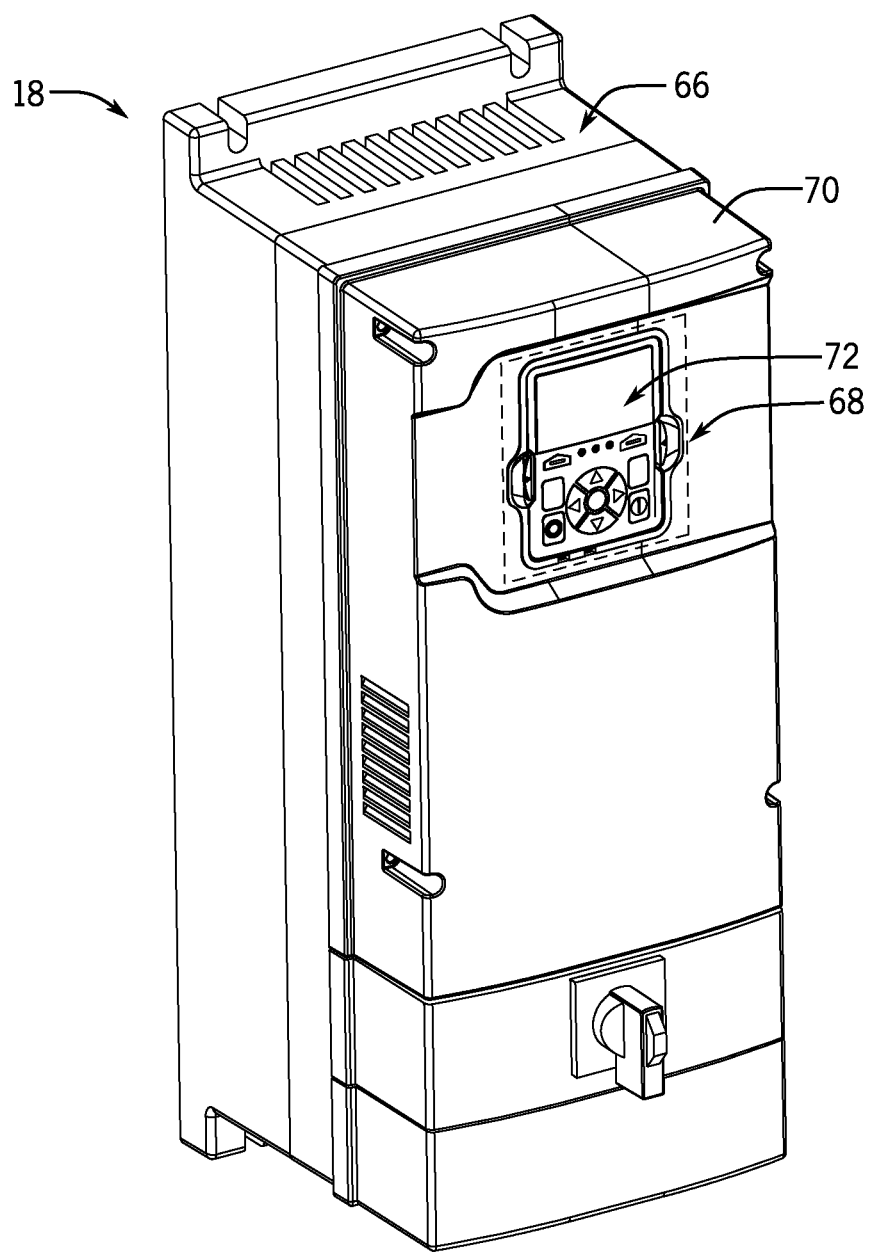
FIG. 5 is a perspective view of a compact housing enclosing the motor control system of FIG. 2 and FIGS. 3A and 3B, according to an embodiment of the invention.

According to one embodiment, housing 66 may be formed with an opening 68 in a front door 70 thereof to accommodate a human-machine interface (HMI) or control panel 72 of the motor control system 18. As shown in FIGS. 3A and 3B and FIG. 5, the control panel 72 is mounted directly to PCB 28 and may extend out therefrom to fit within opening 68, so as to be accessible by a user even when front door 70 is closed. The control panel 72 may facilitate installation, operation, maintenance, or other interactions with the motor control system 18. The control panel 72 includes a user interface 74 that, may include hands-off-auto selector buttons, a touch screen LCD display, a jumper/selector switch, indicator lights, and/or connection ports or I/Os for connecting external electronic devices (e.g., laptop or other mobile computing and networking devices) for fast setup or remote monitoring purposes (i.e., receiving outputs from motor control system 18), to name but a few non-limiting examples. Of course those skilled in the relevant art will appreciate that additional, fewer, or alternative user interface components could be employed without departing from the scope of the present subject matter.

Additional embodiments of the invention may also provide for alternative means of communicating with the motor control system 18, such as by providing for wireless communication with the motor control system 18 over a local network/server or via a cloud-based system/platform—generally designated as "communication 76" in FIG. 2. Monitoring or control of the motor control system 18 may be achieved via a remote device (e.g., laptop or other mobile computing and networking devices), with the remote device being able to access any combination of digital or analog signals from the motor control system 18 indicating a current state of the components thereof and their associated processes (e.g., operational mode, fault status, diagnostics, temperature, etc.). According to one embodiment, motor control system 18 can be coupled to a cloud platform 76 to leverage cloud-based applications and services. That is, the motor control system 18 can be configured to interact with cloud-based computing services hosted by cloud platform 76. Cloud platform 76 can be any infrastructure that allows shared computing services to be accessed and utilized by cloud-capable devices. Cloud platform 76 can be a public or private cloud accessible via the Internet by a motor control system 18 having Internet connectivity and appropriate authorizations to utilize the services. Cloud services can include, but are not limited to, data storage, data analysis, control applications (e.g., applications that can generate and deliver control instructions to motor control system 18 based on analysis of near real-time system data or other factors), system management applications, or other such applications. If cloud platform 76 is a web-based cloud, motor control system 18 may interact with cloud services via the Internet. In an exemplary configuration, motor control system 18 may access the cloud services through a cloud gateway, where the motor control system 18 connect to the cloud gateway through a physical or wireless local area network or radio link or through an integrated cloud gateway service.

Figure 6:
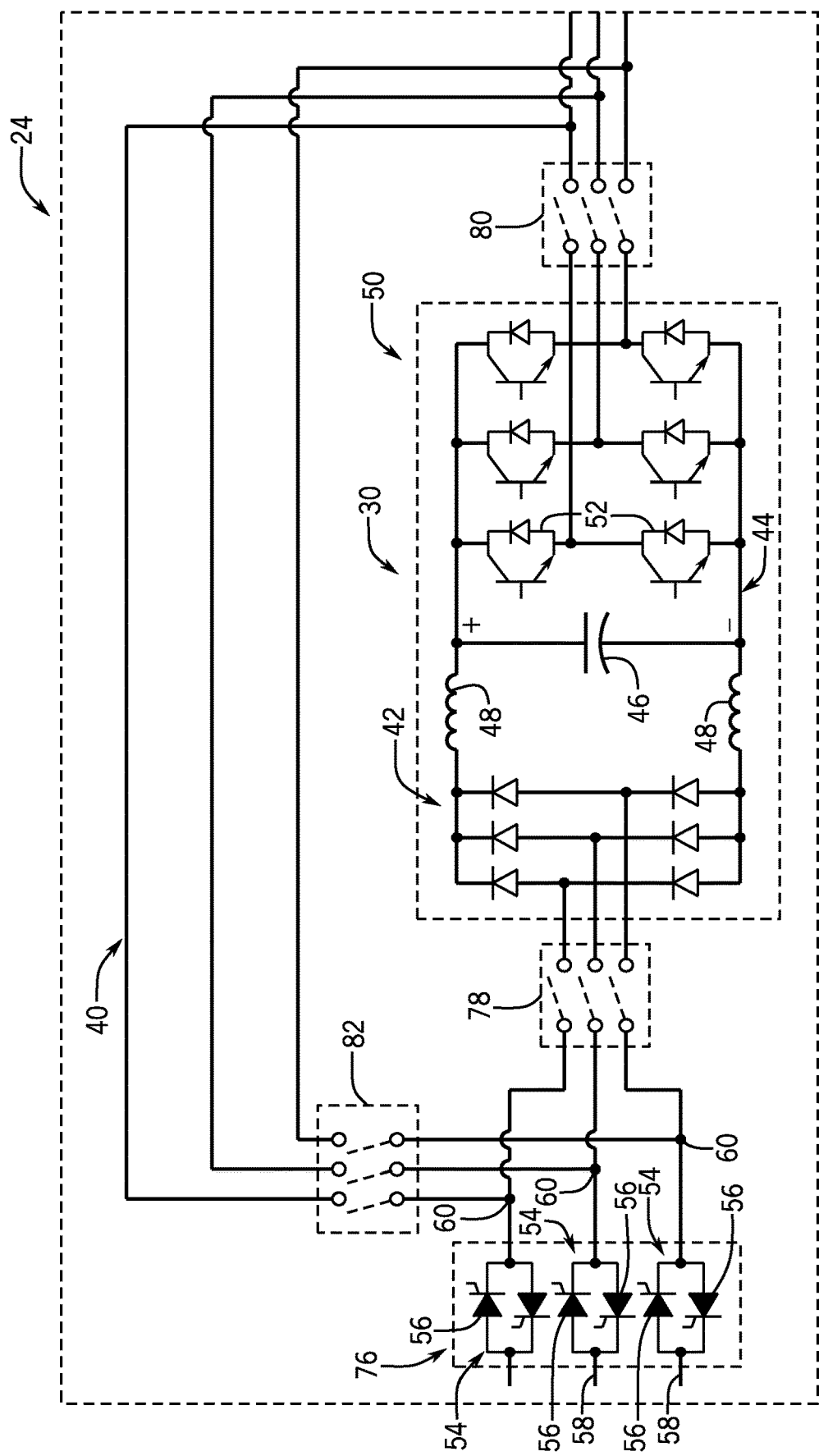
FIG. 6 is a schematic diagram of a motor switching assembly, according to another embodiment of the invention.

Referring now to FIG. 6, an additional embodiment of a board-level motor control system 18 is illustrated where motor control assembly 24 includes a modified arrangement of protection and control components thereon. In the embodiment of FIG. 6, the arrangement of switching devices 34, 36, 38 illustrated in FIG. 4 is replaced with an arrangement of a solid-state switching unit 76 and lower rated input, output and bypass relays 78, 80, 82. With regard to solid-state switching unit 76, the unit includes a pair of anti-parallel switches 56 (e.g., SCRs or thyristors) on each supply line of the three-phase input that are selectively switched to control the current flow through solid-state switching unit—with switches 56 being selectively controlled to conduct current therethrough, block current, or to provide a controlled power output to enable a ramping or soft-starting of motor. With regard to the input relay 78, output relay 80, and bypass relay 82, the relays may 78, 80, 82 be provided as electro-mechanical or solid state relays that have a rating lower than a full motor voltage rating and lower than inrush current ratings. That is, as can be seen in FIG. 6, the solid-state switching unit 76 is positioned upstream from input relay 78 and bypass relay 82 and from where input power is directed to either the bypass path 40 or to VFD unit 30 based on controlling of the input relay 78 and bypass relay 82. The positioning of solid-state switching unit 76 at a location upstream from input and bypass relays 78, 82 allows for switching of the input and bypass relays 78, 82 at a zero load condition, as the SCRs 56 may be switched to an Off/non-conducting state for a period during which the relays are switched. Accordingly, the input, output, and bypass relays 78, 80, 82, may be in the form of lower rated relays having a voltage rating that is less than a full motor voltage of motor 22 and less than inrush current ratings.

Beneficially, embodiments of the invention thus provide a board-level motor control system that integrates power conversion, protection and control devices onto a PCB structure, thereby eliminating wiring between discrete components so as to reduce cable losses, require fewer terminal connections, and eliminate voltage losses of those connections, such that a more efficient motor control system is provided. The board-level motor control system may derive control powers from input power provided by utility source and provide for efficient temperature monitoring and management of a motor switching assembly in the system. The board-level motor control system may eliminate the need for environmentally rated housing on individual components and instead may be housed within a single compact plastic enclosure. Integration of electromechanical and/or solid-state switching devices into the board-level motor control system provides electrical isolation and enables transitioning between operational modes, with the integrated switching devices providing for flexibility in routing power to a power converter or a bypass around the power converter and transitioning between modes.

According to one embodiment of the present invention, a motor control system for selectively controlling power from a power source to a load is provided. The motor control system includes at least one printed circuit board (PCB) structure and a plurality of protection and control components mounted onto the at least one PCB structure so as to be electrically coupled therewith. The plurality of protection and control components includes a power converter operable to provide a controlled output power to the load, a plurality of switching devices operable to selectively control power flow from the power source into the power converter and to bypass the power converter, and one or more protection devices configured to selectively interrupt current flow from the power source to the power converter during a fault condition. The motor control system also includes a housing enclosing the at least one PCB structure and the plurality of protection and control components.

According to another embodiment of the present invention, a motor control system for selectively controlling power from a power source to a load, is provided. The motor control system includes a PCB structure comprising at least one substrate and a plurality of conductive traces formed on the at least one substrate and a motor switching assembly integrated onto the PCB structure. The motor switching assembly further includes a power converter operable to provide a controlled output power to the load and a plurality of switching devices operable to selectively control power flow from the power source into the power converter and to bypass the power converter. The motor control system also includes a controller coupled to the PCB structure and configured to control operation of the power converter and the plurality of switching devices. The conductive traces form electrical connections within the motor switching assembly and electrically connect the motor switching assembly to the controller.

According to yet another embodiment of the present invention, a method of manufacturing a board-level motor control system for controlling power from a power source to a load is provided. The method includes providing a PCB structure comprising at least one substrate and a plurality of conductive traces formed on the at least one substrate and mounting a plurality of protection and control components onto the PCB structure, wherein mounting the plurality of protection and control components comprises one of snapping respective plug-and-play components of the plurality of protection and control components onto the PCB structure and soldering respective components of the plurality of protection and control components onto the PCB structure. The method also includes electrically connecting the plurality of protection and control components via the plurality of conductive traces.

The present invention has been described in terms of the preferred embodiment, and it is recognized that equivalents, alternatives, and modifications, aside from those expressly stated, are possible and within the scope of the appending claims.

What is claimed is:

1. A motor control system for selectively controlling power from a power source to a load, the motor control system comprising:
   at least one printed circuit board (PCB) structure; and
   a plurality of protection and control components mounted onto the at least one PCB structure so as to be electrically coupled therewith, the plurality of protection and control components comprising:
      a power converter operable to provide a controlled output power to the load;
      a plurality of switching devices operable to selectively control power flow from the power source into the power converter and to bypass the power converter; and
      one or more protection devices configured to selectively interrupt current flow from the power source to the power converter during a fault condition; and
   a housing enclosing the at least one PCB structure and the plurality of protection and control components.

2. The motor control system of claim 1 wherein the housing is environmentally rated for the motor control system, and wherein each of the plurality of protection and control components is free of a discrete, environmentally rated housing.

3. The motor control system of claim 1 further comprising a control system configured to control operation of the power converter and the plurality of switching devices, the control system programmed to control switching of the plurality of switching devices between On and Off states to selectively route power to the power converter and bypass the power converter.

4. The motor control system of claim 3 wherein the at least one PCB structure comprises a substrate and a plurality of conductive traces formed on the substrate, with the plurality of conductive traces forming electrical connections between the plurality of protection and control components and the control system.

5. The motor control system of claim 3 further comprising a control panel coupled to the at least one PCB structure, the control panel comprising a user interface configured to receive inputs from a user and provide the inputs to the control system.

6. The motor control system of claim 5 wherein the housing comprises a front door; and
   wherein the user interface is accessible to the user through an opening formed in the front door when the front door is in a closed position.

7. The motor control system of claim 3 wherein the control system and the plurality of protection and control components are powered by the power source.

8. The motor control system of claim 1 wherein the plurality of protection and control components comprise plug-and-play components that clip onto the at least one PCB structure.

9. The motor control system of claim 1 wherein the plurality of protection and control components are soldered directly onto the at least one PCB structure.

10. The motor control system of claim 1 further comprising one or more thermal management devices that provide system-level thermal management for the motor control system, with shared cooling of the power converter and the plurality of switching devices.

11. The motor control system of claim 1 wherein the one or more protection devices comprises one or more of:
   an input fuse that provides overcurrent protection to the power converter and the plurality of switching devices, the input fuse mounted on the at least one PCB structure; and
   a disconnect contactor operable to disconnect the motor control system from the power source, the disconnect contactor configured to interface with the at least one PCB structure.

12. The motor control system of claim 1 wherein the plurality of switching devices integrated onto the at least one PCB structure comprises:
   an input relay positioned upstream of the power converter to control power flow into the power converter;
   an output relay positioned downstream of the power converter to control power flow output from the power converter; and
   a solid-state switching device comprising a plurality of solid-state switches that are selectively switchable to control and condition power flow therethrough, the solid-state switching device arranged upstream from the input relay or in parallel with the input relay.

13. The motor control system of claim 12 wherein the solid-state switching device functions as an overload relay when overvoltage and/or overcurrent conditions are present in the motor control system.

14. A motor control system for selectively controlling power from a power source to a load, the motor control system comprising:
   a printed circuit board (PCB) structure comprising at least one substrate and a plurality of conductive traces formed on the at least one substrate;
   a motor switching assembly integrated onto the PCB structure, the motor switching assembly comprising:
      a power converter operable to provide a controlled output power to the load; and
      a plurality of switching devices operable to selectively control power flow from the power source into the power converter and to bypass the power converter; and a controller coupled to the PCB structure and configured to control operation of the power converter and the plurality of switching devices;

wherein the conductive traces form electrical connections within the motor switching assembly and electrically connect the motor switching assembly to the controller.

15. The motor control system of claim 14 further comprising an environmentally rated housing that encloses the PCB structure, the motor switching assembly, and the controller, and wherein the power converter, the plurality of switching devices, and the controller are each free of a discrete, environmentally rated housing.

16. The motor control system of claim 14 wherein the power converter and the plurality of switching devices comprise plug-and-play components that snap onto the PCB structure.

17. The motor control system of claim 14 wherein the power converter and the plurality of switching devices comprise components that are soldered directly onto the PCB structure.

18. The motor control system of claim 14 further comprising a heat sink mounted to the power converter and a solid-state switching unit of the plurality of switching devices to provide shared cooling thereto.

19. A method of manufacturing a board-level motor control system for controlling power from a power source to a load, the method comprising:

providing a printed circuit board (PCB) structure comprising at least one substrate and a plurality of conductive traces formed on the at least one substrate;

mounting a plurality of protection and control components onto the PCB structure, wherein mounting the plurality of protection and control components comprises one of:

snapping respective plug-and-play components of the plurality of protection and control components onto the PCB structure; and soldering respective components of the plurality of protection and control components onto the PCB structure;

electrically connecting the plurality of protection and control components via the plurality of conductive traces; and operatively connecting a controller to the plurality of protection and control components, with the plurality of conductive traces providing at least a portion of electrical connections between the controller and the plurality of protection and control components, mounting a power converter onto the PCB structure that is operable to provide a controlled output power to the load; and mounting one or more additional protection and control components onto the PCB structure, the one or more additional protection and control components comprising one or more of:

an input relay positioned upstream of the power converter to control power flow into the power converter;

an output relay positioned downstream of the power converter to control power flow output from the power converter; and a solid-state switching device comprising a plurality of solid-state switches that are selectively switchable to control and condition power flow therethrough, the solid-state switching device arranged upstream from the input relay or in parallel with the input relay.

20. The method of claim 19 wherein mounting the plurality of protection and control components comprises:

mounting a power converter onto the PCB structure that is operable to provide a controlled output power to the load; and mounting one or more additional protection and control components onto the PCB structure, the one or more additional protection and control components comprising one or more of:

an input relay positioned upstream of the power converter to control power flow into the power converter;

an output relay positioned downstream of the power converter to control power flow output from the power converter; and a solid-state switching device comprising a plurality of solid-state switches that are selectively switchable to control and condition power flow therethrough, the solid-state switching device arranged upstream from the input relay or in parallel with the input relay.

* * * * *